United States Patent [19]
Lee

[11] Patent Number: 6,035,345
[45] Date of Patent: Mar. 7, 2000

[54] SERIAL PORT SWITCHING CIRCUIT FOR SELECTIVELY CONNECTING TWO SERIAL PORTS TO TWO SERIAL COMMUNICATION CONNECTORS IN RESPONSE TO A CONTROL SIGNAL

[75] Inventor: Dae-Ik Lee, Suwon, Rep. of Korea

[73] Assignee: SamSung Electronics Co., Ltd., Kyungki-do, Rep. of Korea

[21] Appl. No.: 08/840,636

[22] Filed: Apr. 25, 1997

[30] Foreign Application Priority Data

Apr. 26, 1996 [KR] Rep. of Korea ............... 96/13116

[51] Int. Cl.[7] ............... G06F 13/14; H03K 17/00; H03K 17/94
[52] U.S. Cl. ............... 710/8; 710/38; 710/132; 710/131
[58] Field of Search ............... 395/828; 340/825.79, 340/825.83; 710/8, 38, 132, 131

[56] References Cited

U.S. PATENT DOCUMENTS

| | | | |
|---|---|---|---|
| 3,593,302 | 7/1971 | Saito et al. | 395/857 |
| 4,032,893 | 6/1977 | Moran | 340/825.83 |
| 4,355,354 | 10/1982 | Kempf et al. | 395/200.67 |
| 4,861,276 | 8/1989 | Muller et al. | 439/365 |
| 5,247,682 | 9/1993 | Nishikawa . | |
| 5,355,507 | 10/1994 | Kondou et al. . | |
| 5,471,585 | 11/1995 | Barakat et al. . | |
| 5,515,512 | 5/1996 | Yamamoto | 395/200.8 |
| 5,604,916 | 2/1997 | Kim et al. | 395/822 |
| 5,621,731 | 4/1997 | Dale et al. | 370/257 |
| 5,680,536 | 10/1997 | Tyuluman | 395/180 |
| 5,751,764 | 5/1998 | Meyer et al. | 375/219 |

OTHER PUBLICATIONS

Satnam Singh Loyal, "PSI WIN and COM2—Please help me !", Jan. 27, 1996.

*Primary Examiner*—Thomas C. Lee
*Assistant Examiner*—Ilwoo Park
*Attorney, Agent, or Firm*—Robert E. Bushnell, Esq.

[57] ABSTRACT

A serial port switching circuit includes an input/output controller contained in a computer system, the input/output controller including first and second serial ports for performing serial data communication with external equipment, first and second connectors connected to the external equipment, and a switching arrangement connected between the first and second serial ports of the input/output controller and the first and second connectors, for selectively connecting the first and second serial ports to the first and second connectors in response to a control signal being applied according to a user's selection to allow the input/output controller to perform the serial data communication with the external equipment. According to the present invention, the user can simply switch the connections between the first and second serial ports of the input/output controller and the first and second connectors.

16 Claims, 5 Drawing Sheets

| COM1 | COM2 | CONTROL SIGNAL | AND1 | AND2 | AND3 | AND4 | OR1 | OR2 | FIRST CONNECTOR | SECOND CONNECTOR |
|---|---|---|---|---|---|---|---|---|---|---|
| S1 | S2 | HIGH | S1 | LOW | S2 | LOW | S1 | S2 | S1 | S2 |
| | | LOW | LOW | S1 | LOW | S2 | S2 | S1 | S2 | S1 |

FIG. 5A

| FIRST CONNECTOR | SECOND CONNECTOR | CONTROL SIGNAL | AND5 | AND6 | AND7 | AND8 | OR3 | OR4 | COM1 | COM2 |
|---|---|---|---|---|---|---|---|---|---|---|
| S1 | S2 | HIGH | C1 | LOW | C2 | LOW | C1 | C2 | C1 | C2 |
| | | LOW | LOW | C1 | LOW | C2 | C2 | C1 | C2 | C1 |

SERIAL PORT SWITCHING CIRCUIT FOR SELECTIVELY CONNECTING TWO SERIAL PORTS TO TWO SERIAL COMMUNICATION CONNECTORS IN RESPONSE TO A CONTROL SIGNAL

CLAIM OF PRIORITY

This application makes reference to, incorporates the same herein, and claims all benefits accruing under 35 U.S.C. §119 from an application for SERIAL PORT SWITCHING CIRCUIT earlier filed in the Korean Industrial Property Office on the 26$^{th}$ day of Apr. 1996 and there duly assigned Ser. No. 13116/1996, a copy of which application is annexed hereto.

BACKGROUND OF THE INVENTION

1. Field of the Invention

The present invention relates in general to a computer system, and more particularly to a serial port switching circuit for selectively connecting two serial ports of an input/output controller to two serial communication connectors which are connected to external equipment, to allow the input/output controller to perform serial data communication with the external equipment.

2. Description of the Prior Art

In general, a computer system includes a central processing unit for controlling the entire operation of the computer system, a read only memory for storing an operating program of the central processing unit therein and a random access memory for storing work data of the central processing unit therein.

A display controller connected to a display is also provided for displaying the operation status of the computer system under the control of the central processing unit.

An input/output controller for performing data communication with external peripheral equipment and other computer systems is also provided.

The central processing unit, read only memory, random access memory, display controller and input/output controller are normally interconnected via a bus.

A keyboard, auxiliary storage units, such as a hard disk drive, a floppy disk drive, etc., are connected to the input/output controller as are parallel and serial ports which are connected to various peripheral equipment such as a printer, a mouse, etc., for performing data communication.

The input/output controller is generally provided with two serial ports which are connected to two serial communication connectors, one having twenty-five pins and a second having nine pins.

For the purpose of switching the connections between the first and second serial connectors and the first and second serial ports of the input/output controller, the user must directly physically switch the cable connections or adjust the addresses of the first and second serial ports of the input/output controller when it is necessary to reverse the connections between the first and second serial ports of the input/output controller and the first and second serial connectors.

As result, much time is required in switching the connections and such switching is very inconvenient.

The following patents each disclose features in common with the present invention but do not teach or suggest the specifically recited circuit for selectively connecting two serial ports of an input/output controller to two serial communication connectors as recited by the present invention.

U.S. Pat. No. 5,247,682 to Kondou et al., entitled System And Method For The Automatic Setting Of A Computer System's I/O Configiuration, U.S. Pat. No. 5,471,585 to Barakat et al, entitled Personal Computer System With Input/Output Controller Having Serial/Parallel Ports And A Feedback Line Indicating Readiness Of The Ports, and U.S. Pat. No. 5,355,507 to Nishikawa, entitled Computer System For Arbitrating The Operation Of A Built-In Modem And External SIO Circuit.

SUMMARY OF THE INVENTION

Therefore, the present invention has been made in view of the above problem, and it is an object of the present invention to provide a serial port switching circuit for simply switching connections between two serial communication connectors and two serial ports of an input/output controller.

In accordance with the present invention, the above and other objects can be accomplished by a provision of a serial port switching circuit constructed with: an input/output controller contained within a computer system, the input/output controller including first and second serial ports for performing serial data communication with external equipment; first and second connectors connected to the external equipment; and a switching arrangement connected between the first and second serial ports of the input/output controller and the first and second connectors, for selectively connecting the first and second serial ports to the first and second connectors in response to a control signal being supplied according to a user's selection to allow the input/output controller to perform the serial data communication with the external equipment.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
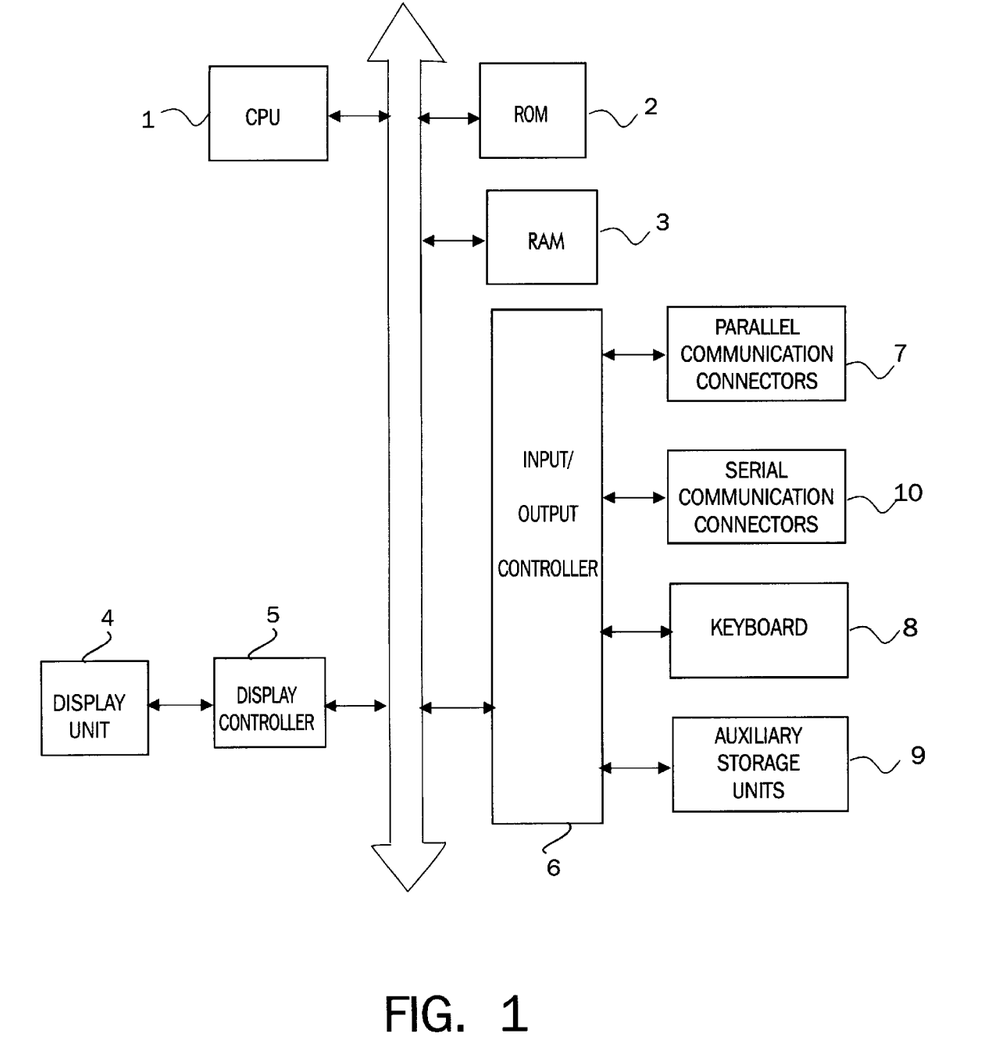
FIG. 1 is a block diagram illustrating the construction of a computer system.

FIG. 1 is a block diagram illustrating the construction of a computer system. In this drawing, the reference numeral 1 designates a central processing unit (CPU) for controlling the entire operation of the computer system. The reference numeral 2 designates a read only memory (ROM) for pre-storing an operating program of the CPU 1 therein. The reference numeral 3 designates a random access memory (RAM) for storing work data of the CPU 3 therein. The reference numeral 5 designates a display controller for displaying the operation status of the computer system on a display unit 4 under the control of the CPU 1. The reference numeral 6 designates an input/output controller for performing data communication with external peripheral equipment and other computer systems. The CPU 1, ROM 2, RAM 3, display controller 5 and input/output controller 6 are interconnected via a bus. A keyboard 8 and auxiliary storage units 9 such as a hard disc drive, a floppy disc drive, etc. are connected to the input/output controller 6.

The input/output controller 6 comprises parallel and serial ports connected to various peripheral equipment such as a printer, a mouse, etc. connected to the computer system and other computer systems, for performing data communication therewith. The parallel and serial ports of the input/output controller 6 are respectively connected to through cables parallel and serial communication connectors 7 and 10 provided in the body of the computer system. The parallel and serial communication connectors 7 and 10 are simply connected to peripheral equipment and other computer systems to allow the input/output controller 6 to perform data communication with the peripheral equipment and other computer systems.

Figure 2:
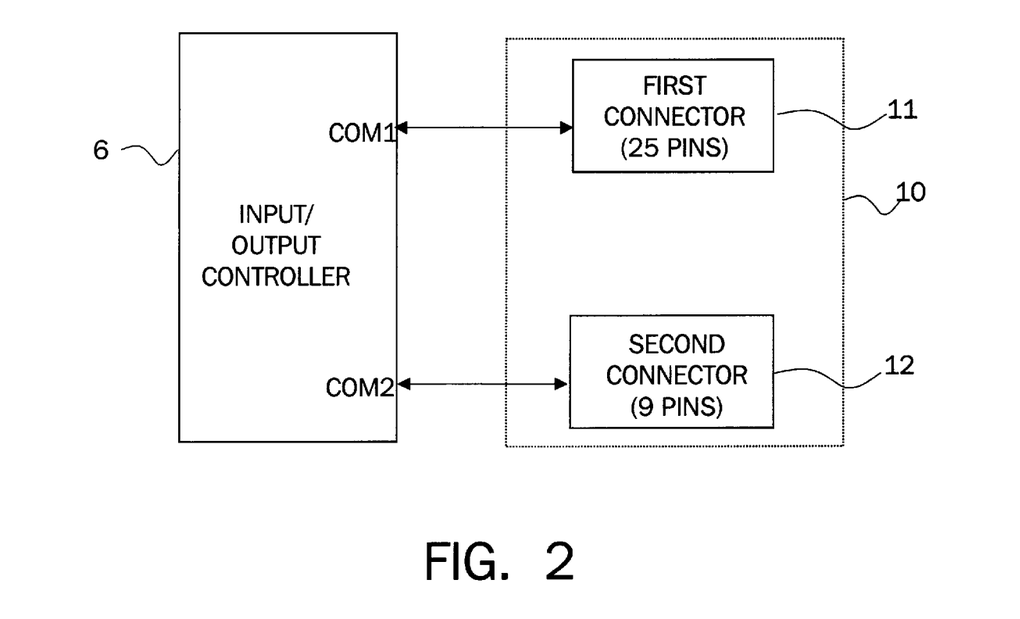
FIG. 2 is a block diagram illustrating connections between serial ports of an input/output controller and serial communication connectors a shown in FIG. 1.

FIG. 2 is a block diagram illustrating the connections between the serial ports of the input/output controller 6 and the serial communication connectors 10 shown in FIG. 1. As shown in this drawing, the input/output controller 6 is generally provided with two serial ports COM1 and COM2 in the case where the computer system is of the IBM compatible type. Also, the serial communication connectors 10 are classified into a first connector 11 with twenty-five pins and a second connector 12 with nine pins which are connected respectively to the first and second serial ports COM1 and COM2 of the input/output controller 6.

The following table shows signals which are transferred through the first and second serial ports COM1 and COM2 of the input/output controller 6.

TABLE 1

| PINS (25 OF FIRST SERIAL PORT COM1 | PINS (9) OF SECOND SERIAL PORT COM2 | SIGNALS | ABBREVIATED FORMS |
| --- | --- | --- | --- |
| 8 | 1 | Data Carrier Detect | DCD |
| 3 | 2 | Receive Data | RX |
| 2 | 3 | Transmit Data | TX |
| 20 | 4 | Data Terminal Ready | DTR |
| 7 | 5 | Signal Ground | GND |
| 6 | 6 | Data Set Ready | DSR |
| 4 | 7 | Request To Send | RTS |
| 5 | 8 | Clear To Send | CTS |
| 22 | 9 | Ring Indicator | RI |

As seen from the table 1 above, the pins of the first and second serial ports COM1 and COM2 of the input/output controller 6 transfer the same signals although they use different pin numbers. For this reason, the first connector 11 with the twenty-five pins and the second connector 12 with the nine pins can selectively be connected to the first and second serial ports COM1 and COM2 of the input/output controller 6 to allow the input/output controller 6 to perform serial data communication with the peripheral equipment and other computer systems. Therefore, it is preferred to selectively connect the first and second connectors 11 and 12 to the first and second serial ports COM1 and COM2 of the input/output controller 6 to allow the input/output controller 6 to perform the serial data communication with the peripheral equipment and other computer systems.

For the purpose of switching the connections between the first and second connectors 11 and 12 and the first and second serial ports COM1 and COM2 of the input/output controller 6, the user must directly switch the cable connections or adjust the addresses of the first and second serial ports COM1 and COM2, as will hereinafter be described in more detail.

Generally, the input/output controller 6 with the first and second serial ports COM1 and COM2 is of the slave type where it is formed integrally with a motherboard or of the card type where it is mounted in a slot of the motherboard. In the slave type, in order to switch the connections between the first and second connectors 11 and 12 and the first and second serial ports COM1 and COM2 of the input/output controller 6, the user must directly switch the cables connected between the first and second connectors 11 and 12 and the first and second serial ports COM1 and COM2 or change the addresses of the first and second serial ports COM1 and COM2 by adjusting a dip switch with reference to a manual of the motherboard.

In the card type, the user must directly switch the cables connected between the first and second connectors 11 and 12 and the first and second serial ports COM1 and COM2 of the input/output controller 6, because the first and second serial ports COM1 and COM2 are directly connected to the first and second connectors 11 and 12. As a result, much time is required in switching the connections between the first and second connectors 11 and 12 and the first and second serial ports COM1 and COM2 of the input/output controller 6. Also, such switching work is very inconvenient.

Now, a serial port switching circuit of the present invention will be mentioned in detail with reference to FIGS. 3 to 6. Some parts in FIGS. 3 to 6 are the same as those in FIGS. 1 and 2. Therefore, like reference numerals designate like parts.

Figure 3:
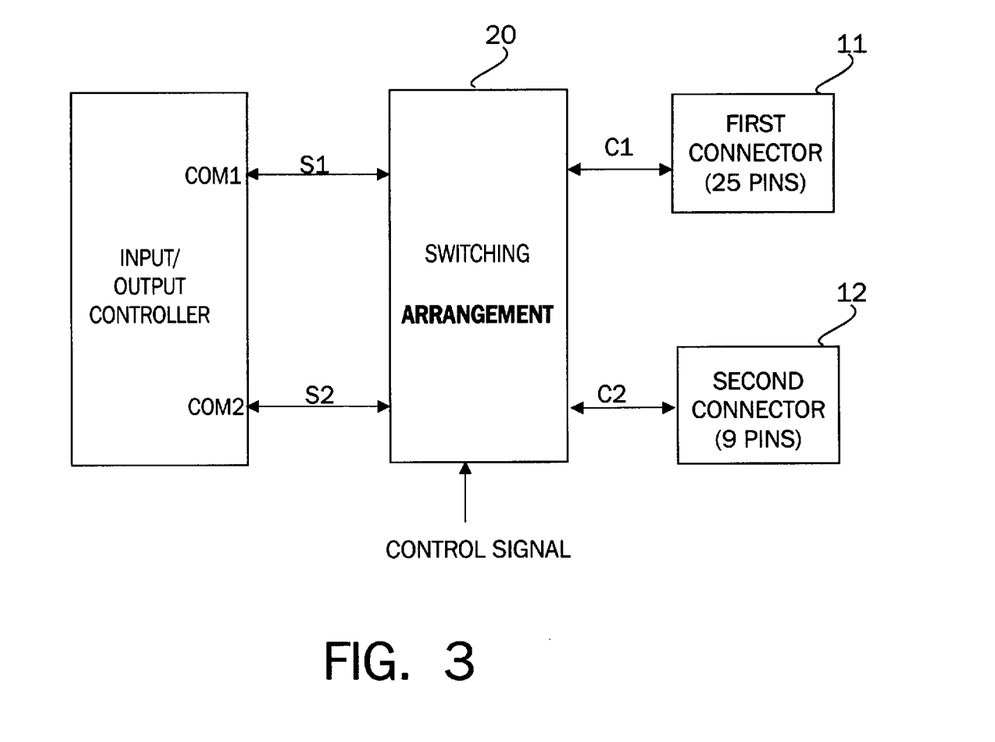
FIG. 3 is a block diagram illustrating the construction of a serial port switching circuit in accordance with the present invention.

Referring to FIG. 3, there is shown in block form the construction of a serial port switching circuit in accordance with the present invention. In this drawing, the reference numeral 6 designates an input/output controller contained within a computer system. The input/output controller 6 includes first and second serial ports COM1 and COM2 for performing serial data communication with external equipment. The reference numerals 11 and 12 designate first and second connectors respectively connected to the external equipment. The first and second connectors 11 and 12 are selectively connected to the first and second serial ports COM1 and COM2 of the input/output controller 6.

The reference numeral 20 designates a switching arrangement of the present invention. The switching arrangement 20 is connected between the first and second serial ports COM1 and COM2 of the input/output controller 6 and the first and second connectors 11 and 12 to selectively connect the first and second serial ports COM1 and COM2 to the first and second connectors 11 and 12 in response to a control signal being supplied according to a user's selection. In other words, when the control signal is at a high voltage level, the switching arrangement 20 connects the first serial port COM1 of the input/output controller 6 to the first connector 11 and the second serial port COM2 of the input/output controller 6 to the second connector 12.

As a result, an output signal S1 from the first serial port COM1 of the input/output controller 6 is transferred to the first connector 11 through the switching arrangement 20, and an output signal C1 from the first connector 11 is transferred to the first serial port COM1 through the switching arrangement 20. Also, an output signal S2 from the second serial port COM2 of the input/output controller 6 is transferred to the second connector 12 through the switching arrangement 20, and an output signal C2 from the second connector 12 is transferred to the second serial port COM2 through the switching arrangement 20.

When the control signal is at a low voltage level, the switching arrangement 20 connects the first serial port COM1 of the input/output controller 6 to the second connector 12 and the second serial port COM2 of the input/output controller 6 to the first connector 11. As a result, the output signal S1 from the first serial port COM1 of the input/output controller 6 is transferred to the second connector 12 through the switching arrangement 20, and the output signal C2 from the second connector 12 is transferred to the first serial port COM1 through the switching arrangement 20. Also, the output signal S2 from the second serial port COM2 of the input/output controller 6 is transferred to the first connector 11 through the switching arrangement 20, and the output signal C1 from the first connector 11 is transferred to the second serial port COM2 through the switching arrangement 20.

The control signal is supplied according to the user's selection. Namely, the user operates a dip switch provided in the body of the computer system to switch the control signal to its high voltage level or its low voltage level. Alternatively, the user may push a desired key on the keyboard 8 to switch the control signal to its high voltage level or its low voltage level.

Figure 4A:
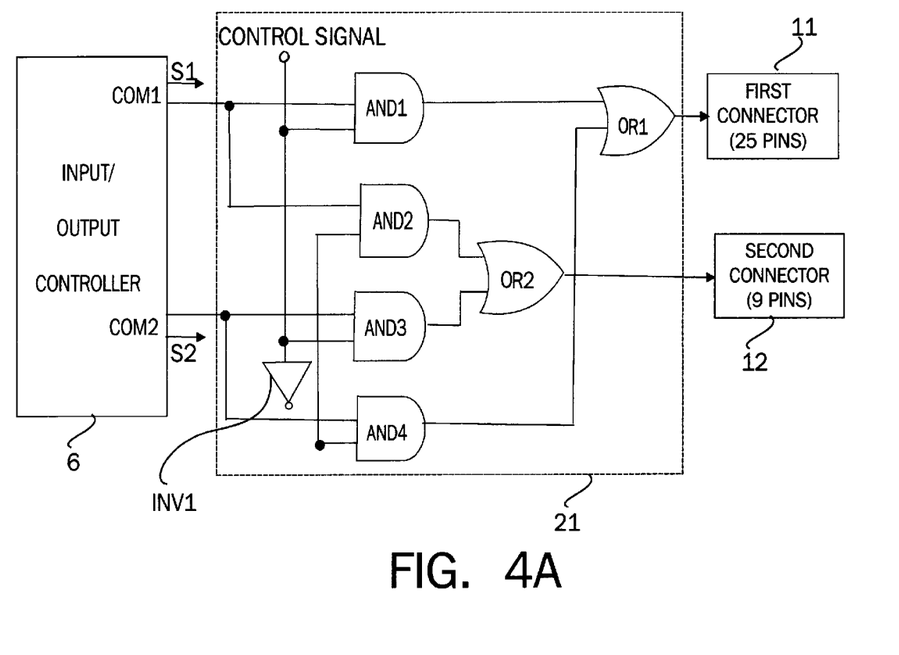
FIGS. 4A and 4B are detailed circuit diagrams illustrating an embodiment of the switching arrangement shown in FIG. 3.
Figure 4B:
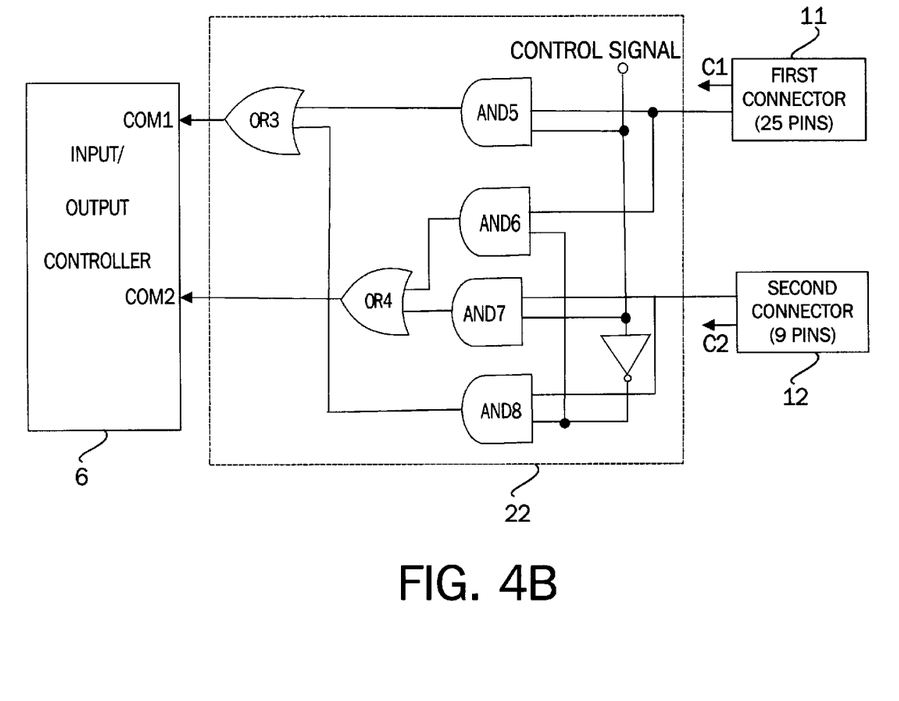

FIG. 4A and 4B are detailed circuit diagrams illustrating an embodiment of the switching arrangement 20 in FIG. 3. FIG. 4A shows a first switching part 21 of the switching arrangement 20. The first switching part 21 is adapted to selectively transfer the output signals S1 and S2 from the first and second serial ports COM1 and COM2 of the input/output controller 6 to the first and second connectors 11 and 12 in response to the control signal.

As shown in FIG. 4A, the first switching part 21 includes a first AND gate AND1 for ANDing the output signal S1 from the first serial port COM1 of the input/output controller 6 and the control signal, a first inverter INV1 for inverting the control signal, a second AND gate AND2 for ANDing the output signal S1 from the first serial port COM1 of the input/output controller 6 and an output signal from the first inverter INV1, a third AND gate AND3 for ANDing the output signal S2 from the second serial port COM2 of the input/output controller 6 and the control signal, and a fourth AND gate AND4 for ANDing the output signal S2 from the second serial port COM2 of the input/output controller 6 and the output signal from the first inverter INV1.

The first switching part 21 further includes a first OR gate OR1 for ORing output signals from the first and fourth AND gates AND1 and AND4 and outputting the ORed result to the first connector 11, and a second OR gate OR2 for ORing output signals from the second and third AND gates AND2 and AND3 and outputting the ORed result to the second connector 12.

FIG. 4B shows a second switching part 22 of the switching arrangement 20. The second switching part 22 is adapted to selectively transfer the output signals C1 and C2 from the first and second connectors 11 and 12 to the first and second serial ports COM1 and COM2 of the input/output controller 6 in response to the control signal. As shown in FIG. 4B, the second switching part 22 includes a fifth AND gate AND5 for ANDing the output signal C1 from the first connector 11 and the control signal, a second inverter INV2 for inverting the control signal, a sixth AND gate AND6 for ANDing the output signal C1 from the first connector 11 and an output signal from the second inverter INV2, a seventh AND gate AND7 for ANDing the output signal C2 from the second connector 12 and the control signal, and an eighth AND gate AND8 for ANDing the output signal C2 from the second connector 12 and the output signal from the second inverter INV2.

The second switching part 22 further includes a third OR gate OR3 for ORing output signals from the fifth and eighth AND gates AND5 and AND8 and outputting the ORed result to the first serial port COM1 of the input/output controller 6, and a fourth OR gate OR4 for ORing output signals from the sixth and seventh AND gates AND6 and AND7 and outputting the ORed result to the second serial port COM2 of the input/output controller 6. It should be noted herein that the construction of the switching arrangement 20 shown in FIGS. 4A and 4B is supplied to each pin of the first and second serial ports COM1 and COM2 of the input/output controller 6 and to each pin of the first and second connectors 11 and 12.

Figure 5A:
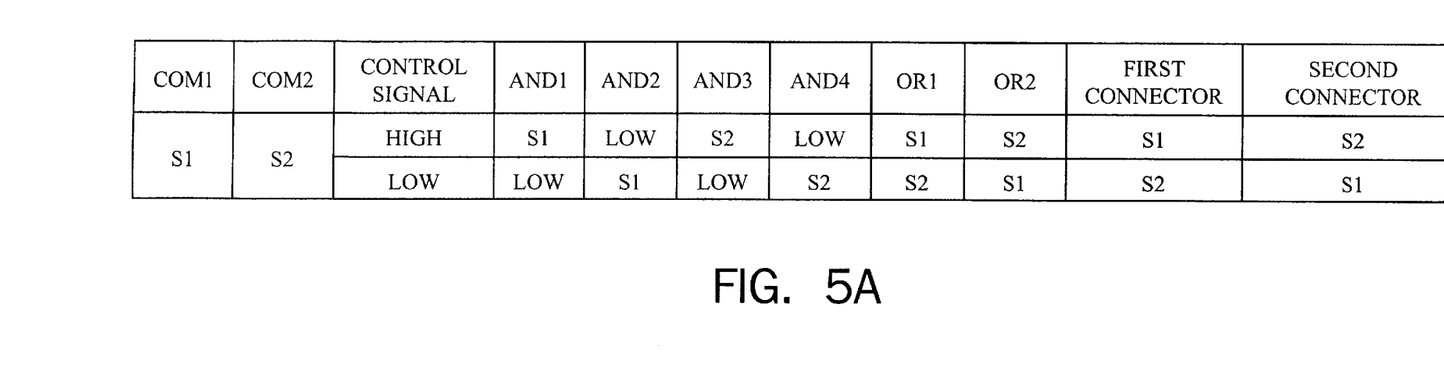
FIGS. 5A and 5B are tables illustrating output signals from components in FIGS. 4A and 4B, respectively; and is
Figure 5B:
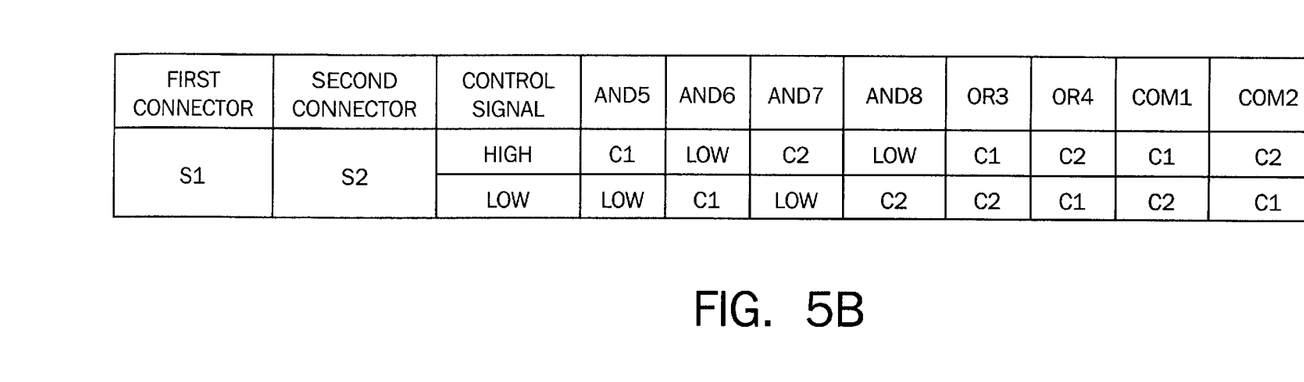

The operation of the embodiment of the switching arrangement 20 with the above-mentioned construction in accordance with the present invention will hereinafter be described in detail with reference to FIGS. 5A and 5B. FIGS. 5A and 5B are tables illustrating the output signals from the components in FIGS. 4A and 4B, respectively. When the control signal is at a high voltage level, it is supplied to the first and third AND gates AND1 and AND3 in the first switching part 21 and the fifth and seventh AND gates AND5 and AND7 in the second switching part 22 to make all of them active. Also, the high voltage level control signal is inverted into its low voltage level by the first inverter INV1 and then supplied to the second and fourth AND gates AND2 and AND4 in the first switching part 21 to make both of them inactive. Further, the high voltage level control signal is inverted into its low voltage level by the second inverter INV2 and then supplied to the sixth and eighth AND gates AND6 and AND8 in the second switching part 22 to make both of them inactive.

As a result, the output signal S1 from the first serial port COM1 of the input/output controller 6 is transferred to the first connector 11 sequentially through the first AND gate AND1 and first OR gate OR1 in the first switching part 21. Also, the output signal S2 from the second serial port COM2 of the input/output controller 6 is transferred to the second connector 12 sequentially through the third AND gate AND3 and second OR gate OR2 in the first switching part 21. Further, the output signal C1 from the first connector 11 is transferred to the first serial port COM1 of the input/output controller 6 sequentially through the fifth AND gate AND5 and third OR gate OR3 in the second switching part 22. The output signal C2 from the second connector 12 is transferred to the second serial port COM2 of the input/output controller 6 sequentially through the seventh AND gate AND7 and fourth OR gate OR4 in the second switching part 22.

In other words, when the control signal is at a high voltage level, the first serial port COM1 of the input/output controller 6 is connected to the first connector 11 and the second serial port COM2 of the input/output controller 6 is connected to the second connector 12. Therefore, the input/output controller 6 performs the data communication with the external equipment connected to the first connector 11 through the first serial port COM1. Also, the input/output controller 6 performs the data communication with the external equipment connected to the second connector 12 through the second serial port COM2.

When the user pushes a desired key on the keyboard 8 or operates the dip switch under the above condition to change the control signal from its high voltage level to its low voltage level, the low voltage level control signal is supplied to the first and third AND gates AND1 and AND3 in the first switching part 21 and the fifth and seventh AND gates AND5 and AND7 in the second switching part 22 to make all of them inactive, in the opposite manner to the case where the control signal is at a high voltage level.

Also, the low voltage level control signal is inverted into its high voltage level by the first inverter INV1 and then applied to the second and fourth AND gates AND2 and AND4 in the first switching part 21 to make both of them active. Further, the low voltage level control signal is inverted into its high voltage level by the second inverter INV2 and then applied to the sixth and eighth AND gates AND6 and AND8 in the second switching part 22 to make both of them active.

As a result, the output signal S1 from the first serial port COM1 of the input/output controller 6 is transferred to the second connector 12 sequentially through the second AND gate AND2 and second OR gate OR2 in the first switching part 21. Also, the output signal S2 from the second serial port COM2 of the input/output controller 6 is transferred to the first connector 11 sequentially through the fourth AND gate AND4 and first OR gate OR1 in the first switching part 21. Further, the output signal C1 from the first connector 11 is transferred to the second serial port COM2 of the input/output controller 6 sequentially through the sixth AND gate AND6 and fourth OR gate OR4 in the second switching part 22. The output signal C2 from the second connector 12 is transferred to the first serial port COM1 of the input/output controller 6 sequentially through the eighth AND gate AND8 and third OR gate OR3 in the second switching part 22.

Namely, when the control signal is at a low voltage level, the first serial port COM1 of the input/output controller 6 is connected to the second connector 12 and the second serial port COM2 of the input/output controller 6 is connected to the first connector 11. Therefore, the input/output controller 6 performs the data communication with the external equipment connected to the first connector 11 through the second serial port COM2. Also, the input/output controller 6 performs the data communication with the external equipment connected to the second connector 12 through the first serial port COM1.

Figure 6:
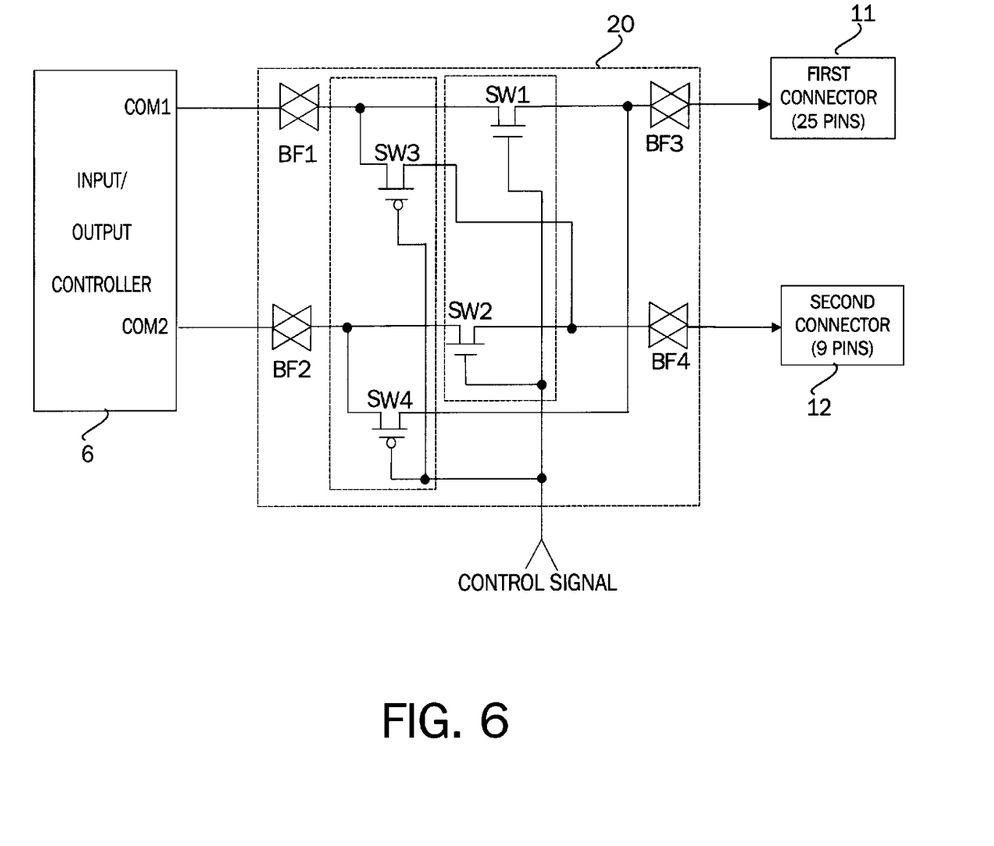
FIG. 6 is a detailed circuit diagram illustrating an alternative embodiment of the switching arrangement shown in FIG. 3.

FIG. 6 is a detailed circuit diagram illustrating an alternative embodiment of the switching arrangement 20 shown in FIG. 3. As shown in this drawing, the switching arrangement 20 includes a first bidirectional switch SW1 which is turned on when the control signal is at a high voltage level, to connect the first serial port COM1 of the input/output controller 6 to the first connector 11, a second bidirectional switch SW2 which is turned on when the control signal is at a high voltage level, to connect the second serial port COM2 of the input/output controller 6 to the second connector 12, a third bidirectional switch SW3 which is turned on when the control signal is at a low voltage level, to connect the first serial port COM1 of the input/output controller 6 to the second connector 12, and a fourth bidirectional switch SW4 which is turned on when the control signal is at a low voltage level, to connect the second serial port COM2 of the input/output controller 6 to the first connector 11.

The switching arrangement 20 further includes first to fourth bidirectional buffers BF1–BF4 connected respectively to the first and second serial ports COM1 and COM2 of the input/output controller 6 and the first and second connectors 11 and 12 to stabilize signals transferred therefrom or thereto. It should be noted herein that the construction of the switching arrangement 20 shown in FIG. 6 is applied to each pin of the first and second serial ports COM1 and COM2 of the input/output controller 6 and to each pin of the first and second connectors 11 and 12.

The operation of the alternative embodiment of the switching arrangement 20 with the above-mentioned construction in accordance with the present invention will hereinafter be described in detail. When the control signal is at a high voltage level, the first and second bidirectional switches SW1 and SW2 are turned on and the third and fourth bidirectional switches SW3 and SW4 are turned off. As a result, the output signal S1 from the first serial port COM1 of the input/output controller 6 is transferred to the first connector 11 sequentially through the first bidirectional buffer BF1, first bidirectional switch SW1 and third bidirectional buffer BF3. Also, the output signal S2 from the second serial port COM2 of the input/output controller 6 is transferred to the second connector 12 sequentially through the second bidirectional buffer BF2, second bidirectional switch SW2 and fourth bidirectional buffer BF4. Further, the output signal C1 from the first connector 11 is transferred to the first serial port COM1 of the input/output controller 6 sequentially through the third bidirectional buffer BF3, first bidirectional switch SW1 and first bidirectional buffer BF1. The output signal C2 from the second connector 12 is transferred to the second serial port COM2 of the input/output controller 6 sequentially through the fourth bidirectional buffer BF4, second bidirectional switch SW2 and second bidirectional buffer BF2.

Namely, when the control signal is at a high voltage level, the first serial port COM1 of the input/output controller 6 and the first connector 11 are connected, and the second serial port COM2 of the input/output controller 6 and the second connector 12 are connected. Therefore, the input/output controller 6 performs the data communication with the external equipment connected to the first connector 11 through the first serial port COM1. Also, the input/output controller 6 performs the data communication with the external equipment connected to the second connector 12 through the second serial port COM2.

When the control signal is at a low voltage level, the first and second bidirectional switches SW1 and SW2 are turned off and the third and fourth bidirectional switches SW3 and SW4 are turned on, in the opposite manner to the case where the control signal is at a high voltage level. As a result, the output signal S1 from the first serial port COM1 of the input/output controller 6 is transferred to the second connector 12 sequentially through the first bidirectional buffer BF1, third bidirectional switch SW3 and fourth bidirectional buffer BF4. Also, the output signal S2 from the second serial port COM2 of the input/output controller 6 is transferred to the first connector 11 sequentially through the second bidirectional buffer BF2, fourth bidirectional switch SW4 and third bidirectional buffer BF3. Further, the output signal C1 from the first connector 11 is transferred to the second serial port COM2 of the input/output controller 6 sequentially through the third bidirectional buffer BF3, fourth bidirectional switch SW4 and second bidirectional buffer BF2. The output signal C2 from the second connector 12 is transferred to the first serial port COM1 of the input/output controller 6 sequentially through the fourth bidirectional buffer BF4, third bidirectional switching device SW3 and first bidirectional buffer BF1.

In other words, when the control signal is at a low voltage level, the first serial port COM1 of the input/output controller 6 and the second connector 12 are connected, and the second serial port COM2 of the input/output controller 6 and the first connector 11 are connected. Therefore, the input/output controller 6 performs the data communication with the external equipment connected to the first connector 11 through the second serial port COM2. Also, the input/output controller 6 performs the data communication with the external equipment connected to the second connector 12 through the first serial port COM2.

As is apparent from the above description, according to the present invention, the switching arrangement is provided between the two serial ports of the input/output controller and the two serial communication connectors connected to the external equipment, to selectively connect the two serial ports to the two serial communication connectors according to the user's selection. Therefore, the user can simply switch the connections between the two serial ports of the input/output controller and the two serial communication connectors to allow the input/output controller to perform the serial data communication with the external equipment, without switching the cables connected between the two serial ports and the two serial communication connectors or changing addresses of the two serial ports.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A serial port switching circuit comprising:
   an input/output controller contained in a computer system, said input/output controller including first and second serial ports for performing serial data communication with external equipment;
   first and second connectors, said first and second connectors being connected to corresponding mating connectors on said external equipment; and
   a switching arrangement connected between said first and second serial ports of said input/output controller and said first and second connectors, for selectively connecting said first and second serial ports to said first and second connectors in response to a control signal to allow said input/output controller to perform the serial data communication with said external equipment.

2. A serial port switching circuit as set forth in claim 1, said switching arrangement comprising:
   a first AND gate for ANDing an output signal from said first serial port of said input/output controller and said control signal;
   an inverter for inverting said control signal;
   a second AND gate for ANDing the output signal from said first serial port of said input/output controller and an output signal from said inverter;
   a third AND gate for ANDing an output signal from said second serial port of said input/output controller and said control signal;
   a fourth AND gate for ANDing the output signal from said second serial port of said input/output controller and the output signal from said inverter;
   a first OR gate for ORing output signals from said first and fourth AND gates and outputting the ORed result to said first connector;
   a second OR gate for ORing output signals from said second and third AND gates and outputting the ORed result to said second connector;
   a fifth AND gate for ANDing an output signal from said first connector and said control signal;
   a sixth AND gate for ANDing the output signal from said first connector and the output signal from said inverter;
   a seventh AND gate for ANDing an output signal from said second connector and said control signal;
   an eighth AND gate for ANDing the output signal from said second connector and the output signal from said inverter;
   a third OR gate for ORing output signals from said fifth and eighth AND gates and outputting the ORed result to said first serial port of said input/output controller and
   a fourth OR gate for ORing output signals from said sixth and seventh AND gates and outputting the ORed result to said second serial port of said input/output controller.

3. A serial port switching circuit as set forth in claim 1, said switching arrangement comprising:
   a first bidirectional switch, which is turned on when said control signal is at a first voltage level for connecting said first serial port of said input/output controller to said first connector;
   a second bidirectional switch, which is turned on when said control signal is at said first voltage level, for connecting said second serial port of said input/output controller to said second connector;
   a third bidirectional switch, which is turned on when said control signal is at a second voltage level different from said first voltage level, for connecting said first serial port of said input/output controller to said second connector; and
   a fourth bidirectional switch, which is turned on when said control signal is at said second voltage level, for connecting said second serial port of said input/output controller to said first connector.

4. A serial port switching circuit as set forth in claim 3, said switching arrangement further comprising:
   first to fourth bidirectional buffers respectively connected to said first and second serial ports of said input/output controller and said first and second connectors for stabilizing signals transferred therefrom or thereto.

5. A serial port switching circuit as set forth in claim 1, said control signal being switched by pushing a particular key on a keyboard or operating a switch provided in the body of said computer system.

6. A serial port switching circuit as set forth in claim 2, said control signal being switched by pushing a particular key on a keyboard or operating a switch provided in the body of said computer system.

7. A serial port switching circuit as set forth in claim 3, said control signal being switched by pushing a particular key on a keyboard or operating a switch provided in the body of said computer system.

8. A serial port switching circuit as set forth in claim 1, said first connector being a serial communication connector with twenty-five pins and said second connector being a serial communication connector with nine pins.

9. A serial port switching circuit as set forth in claim 2, said first connector being a serial communication connector with twenty-fine pins and said second connector being a serial communication connector with nine pins.

10. A serial port switching circuit as set forth in claim 3, said first connector being a serial communication connector with twenty-five pins and said second connector being a serial communication connector with nine pins.

11. A serial port switching circuit as set forth in claim 4, said first connector being a serial communication connector with twenty-five pins and said second connector being a serial communication connector with nine pins.

12. A serial port switching circuit as set forth in claim 3, said first voltage level being higher than said second voltage level.

13. A serial port switching circuit as set forth in claim 7, said first voltage level being higher than said second voltage level.

14. A serial port switching circuit as set forth in claim 10, said first voltage level being higher than said second voltage level.

15. A serial port switching circuit comprising:

an input/output controller contained in a computer system, said input/output controller including first and second serial ports for performing serial data communication with external equipment;

first and second connectors connected to said external equipment, said first connector being a serial communication connector with twenty-five pins and said second connector being a serial communication connector with nine pins, said first connector having at least one pin corresponding to each pin of said second connector; and a switching arrangement connected between said first and second serial ports of said input/output controller and said first and second connectors, for switching the connection of said first and second serial ports between to said nine pins of said second connector and to said corresponding pins of said first connector in response to a control signal to allow said input/output controller to perform the serial data communication with said external equipment.

16. A serial switching circuit as set forth in claim 15, said first serial port having twenty-five pins and said second serial port having nine pins, said first serial port having at least one pin corresponding to each pin of said second serial port, said switching arrangement switching the connection of said first and second connector between to said nine pins of said second serial port and to said corresponding pins of said first serial port.

* * * * *